(12) United States Patent
Wu et al.

(10) Patent No.: US 9,372,400 B2
(45) Date of Patent: Jun. 21, 2016

(54) GRAYSCALE MASK PLATE, COLOR FILM SUBSTRATE, RELATED FABRICATING METHODS, AND DISPLAY DEVICE

(71) Applicants: Boe Technology Group Co., Ltd., Beijing (CN); Beijing Boe Display Technology Co., Ltd., Beijing (CN)

(72) Inventors: Hongjiang Wu, Beijing (CN); Jianfeng Yuan, Beijing (CN); Min Li, Beijing (CN)

(73) Assignees: Boe Technology Group Co., Ltd., Beijing (CN); Beijing Boe Display Technology Co., Ltd., Beijing (CN)

( * ) Notice: Subject to any disclaimer, the term of this patent is extended or adjusted under 35 U.S.C. 154(b) by 0 days.

(21) Appl. No.: 14/500,350

(22) Filed: Sep. 29, 2014

(65) Prior Publication Data

US 2015/0370163 A1     Dec. 24, 2015

(30) Foreign Application Priority Data

Jun. 24, 2014    (CN) ........................ 2014 1 0286326

(51) Int. Cl.
*G02F 1/1339*     (2006.01)
*G02F 1/1335*     (2006.01)
*G02B 5/20*       (2006.01)
*G03F 7/00*       (2006.01)
*G02F 1/1368*     (2006.01)
*G03F 1/50*       (2012.01)

(52) U.S. Cl.
CPC .............. *G03F 7/0007* (2013.01); *G02B 5/201* (2013.01); *G02F 1/1368* (2013.01); *G02F 1/13394* (2013.01); *G02F 1/133514* (2013.01); *G03F 1/50* (2013.01)

(58) Field of Classification Search
CPC ........... G03F 7/0007; G03F 1/50; G03F 1/58; G03F 1/68; G02F 1/13394
USPC ........................................... 430/5, 7; 349/156
See application file for complete search history.

(56) References Cited

U.S. PATENT DOCUMENTS 6,420,073 B1 *   7/2002   Suleski ............... G02B 3/0012
                                                         430/5
2010/0040960 A1 *   2/2010   Piao ........................ G03F 1/144
                                                         430/5

FOREIGN PATENT DOCUMENTS

JP     2001-033790 A   *   2/2001
JP     2002-229040 A   *   8/2002

OTHER PUBLICATIONS

Computer-generated translation of JP 2001-033790 (Feb. 2001).*
Computer-generated translation of JP 2002-229040 (Aug. 2002).*

* cited by examiner

*Primary Examiner* — John A McPherson
(74) *Attorney, Agent, or Firm* — Calfee, Halter & Griswold LLP (57) ABSTRACT

A grayscale mask plate and method of fabricating the same, a color film substrate and method of fabricating the same, and a display device are disclosed. The grayscale mask plate comprises a transparent substrate and a light blocking layer on the transparent substrate. The light blocking layer comprises an exposure region with an optical translucent film which has a light blocking ratio decreasing gradually or stepwise from a center of the optical translucent film to an edge of the optical translucent film. As a result, the intensity of light transmitted through the exposure region is uniform, such that a post spacer fabricated by the grayscale mask plate has a relatively flat top face. Thus, the post spacer exhibits a linear variation in its hardness under the action of an external force.

4 Claims, 10 Drawing Sheets

FIG. 1

PRIOR ART

FIG. 2

PRIOR ART

FIG. 3

PRIOR ART

GRAYSCALE MASK PLATE, COLOR FILM SUBSTRATE, RELATED FABRICATING METHODS, AND DISPLAY DEVICE

RELATED APPLICATIONS

The present application claims the benefit of Chinese Patent Application No. 201410286326.5, filed Jun. 24, 2014, the entire disclosure of which is incorporated herein by reference.

FIELD

The present disclosure relates to the field of display technology, and particularly to a spacer mask plate and a method of fabricating the same, a color film substrate and a method of fabricating the same, and a display device.

BACKGROUND

A panel in a liquid crystal display comprises an array substrate and a color film substrate which are arranged in parallel and opposite one another, between which a liquid crystal layer is arranged. In order to realize a steady thickness of the liquid crystal layer, a spacer is arranged between the two substrates. Currently, a high-performance thin film transistor liquid crystal display (TFT-LCD) panel generally uses a post spacer (PS).

During the fabricating process of the existing thin film transistor liquid crystal display panel, the top face of the post spacer has a convex shape. Under the action of an external force, the top face of the post spacer has a relatively small contact area, while the post spacer itself is elastic and has a relatively large deformation capacity. In addition, with the change in the contact area, the post spacer exhibits a nonlinear variation in its hardness. These properties of the post spacer result in defects in the liquid crystal panel which is sensitive to variation in external pressure. For example, when the liquid crystal panel is in the grayscale L0 black state, the liquid crystal panel may suffer from light leakage (i.e., L0 light leakage). The liquid crystal panel may also suffer from Touch Mura. These defects seriously degrade the display quality of the liquid crystal panel.

In general, the post spacer has a convex top face because of the conventional method for fabricating the post spacer. In the conventional fabricating method, firstly, negative photoresist, which will develop into insoluble material if irradiated by light, is coated on a color film substrate. Then, the negative photoresist is exposed and developed by using a mask plate, in which a portion of the negative photoresist which has been irradiated by light is dissolved and removed, while the negative photoresist under the exposure region of the mask plate becomes insoluble and forms a post spacer. However, in the conventional mask plate, the intensity of light that is transmitted through the exposure region is not uniform, but instead decreases gradually from a center region to an edge region. As a result, the center region of the negative photoresist under the exposure region is irradiated by light with higher intensity and the edge region is irradiated by light with lower intensity, so that upon developing, the negative photoresist in the edge region will be dissolved to a larger extent. In this way, the resultant post spacer has a convex top face.

SUMMARY

The present disclosure provides a grayscale mask plate and a method of fabricating the same, a color film substrate and a method of fabricating the same, and a display device. According to the present disclosure, the post spacer fabricated by the grayscale mask plate has a substantially flat top face and exhibits a linear variation in hardness under the action of an external force, thus avoiding or otherwise alleviating defects in the liquid crystal panel which is sensitive to variation in external pressure.

In an exemplary embodiment, a grayscale mask plate comprises a transparent substrate and a light blocking layer on the transparent substrate, wherein the light blocking layer comprises an exposure region, wherein the exposure region is provided with an optical translucent film, and wherein the optical translucent film has a light blocking ratio which decreases gradually or stepwise from a center region to an edge region of the optical translucent film.

According to the present disclosure, since the optical translucent film in the exposure region has a light blocking ratio which decreases gradually or stepwise from the center region to the edge region of the optical translucent film, the intensity of light that is transmitted through the exposure region is substantially uniform across the exposure region, which facilitates fabrication of a post spacer with a flat top face.

In an exemplary embodiment, the thickness of the optical translucent film decreases gradually or stepwise from the center region to the edge region of the optical translucent film.

In an exemplary embodiment, the optical translucent film comprises multiple layers of unit optical translucent film. In the direction away from the transparent substrate, an upper layer of unit optical translucent film is formed above a lower layer of unit optical translucent film, and the upper layer of unit optical translucent film has a smaller area than the lower layer of unit optical translucent film.

In an exemplary embodiment, the optical translucent film comprises multiple layers of unit optical translucent film. In the direction away from the transparent substrate, an upper layer of unit optical translucent film is formed above a lower layer of unit optical translucent film, the upper layer of unit optical translucent film has a larger area than the lower layer of unit optical translucent film, and apart from the lowest layer of unit optical translucent film, each layer of unit optical translucent film is distributed in each layer from the lowest layer of unit optical translucent film to itself.

In an exemplary embodiment, a method of fabricating a grayscale mask plate comprises forming a light blocking layer with an exposure region on a transparent substrate; and forming an optical translucent film in the exposure region, wherein the optical translucent film has a light blocking ratio which decreases gradually or stepwise from a center region to an edge region of the optical translucent film.

In an exemplary embodiment, the step of forming an optical translucent film in the exposure region comprises forming multiple layers of unit optical translucent film in sequence in the exposure region, so that in the direction away from the transparent substrate, an upper layer of unit optical translucent film is formed above a lower layer of unit optical translucent film, and the upper layer of unit optical translucent film has a smaller area than the lower layer of unit optical translucent film.

In an exemplary embodiment, the step of forming an optical translucent film in the exposure region comprises forming multiple layers of unit optical translucent film in sequence in the exposure region, so that in the direction away from the transparent substrate, an upper layer of unit optical translucent film is formed above a lower layer of unit optical translucent film, the upper layer of unit optical translucent film has a larger area than the lower layer of unit optical translucent film, and apart from the lowest layer of unit optical translucent film, each layer of unit optical translucent film is distributed in each layer from the lowest layer of unit optical translucent film to itself.

In an exemplary embodiment, a method of fabricating a color film substrate comprises providing a substrate which is formed with a color filtering layer, coating negative photoresist on the substrate, exposing the negative photoresist by using the above-mentioned grayscale mask plate, and removing a portion of the negative photoresist which has not been irradiated by light, such that the negative photoresist under the exposure region of the grayscale mask plate forms a post spacer.

In an exemplary embodiment, a color film substrate is fabricated by the above-mentioned method of fabricating a color film substrate, wherein the post spacer formed on the color film substrate has a flat top face.

In an exemplary embodiment, a display device comprises an array substrate and the above-mentioned color film substrate, wherein the post spacer of the color film substrate forms a space between the color film substrate and the array substrate, and liquid crystal is arranged in the space.

In the grayscale mask plate, the optical translucent film in the exposure region has a light blocking ratio which decreases gradually or stepwise from the center region to the edge region, so that the intensity of light that is transmitted through the exposure region is overall substantially uniform. Therefore, the post spacer fabricated by the grayscale mask plate has a top face which is substantially flat, instead of the convex shape of conventional post spacers. In this way, under the action of an external force, the post spacer exhibits a linear variation in its hardness, thus avoiding or alleviating defects like L0 light leakage and Touch Mura of the liquid crystal panel which is sensitive to variation of external pressure.

BRIEF DESCRIPTION OF THE DRAWINGS

Several technical aspects of the present disclosure will be described in more detail below with reference to the accompanying drawings in order for those skilled in the art to be able to carry out the present disclosure. The present disclosure may, however, be embodied in many different forms and should not be construed as limited to the exemplary embodiments set forth herein. In particular, the general inventive concepts are not intended to be limited by the various illustrative embodiments disclosed herein.

DETAILED DESCRIPTION

The present invention and associated general inventive concepts will be further described hereinafter in detail with reference to the accompanying drawings and various exemplary embodiments. One of ordinary skill in the art will appreciate that these exemplary embodiments only constitute a fraction of the possible embodiments encompassed by the present invention and associated general inventive concepts. As such, the scope of the present disclosure is by no means limited to the exemplary embodiments set forth herein.

Figure 1:
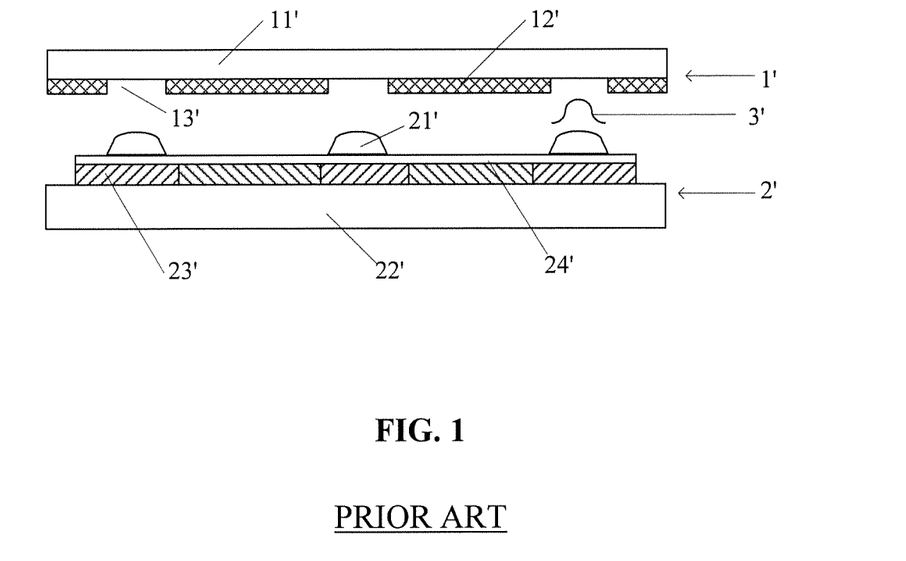
FIG. 1 is a schematic diagram illustrating a conventional grayscale mask plate and a color film substrate formed by the same.
Figure 2:
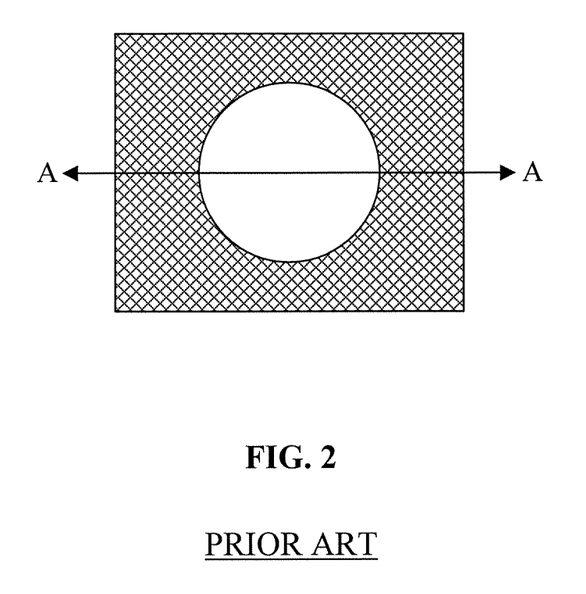
FIG. 2 is a schematic diagram illustrating an exposure region and its surrounding light-blocking part of a conventional grayscale mask plate.
Figure 3:
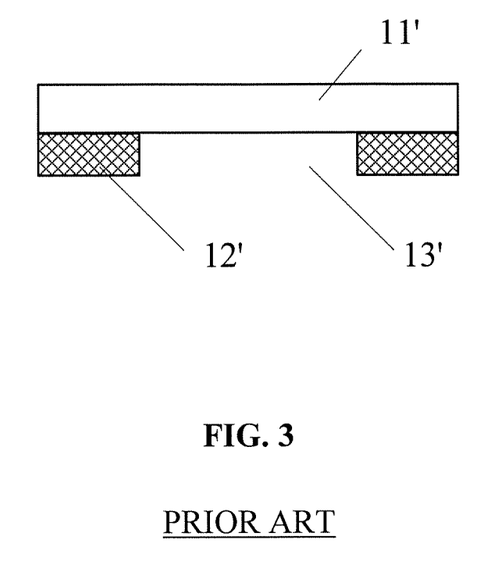
FIG. 3 is a cross-sectional view along the line A-A in FIG. 2.

To provide a better understanding of various exemplary features and advantages of the present disclosure, a conventional grayscale mask plate is described for comparison by referring to FIGS. 1, 2, and 3. As shown in FIGS. 1, 2, and 3, the conventional spacer mask plate 1' comprises a transparent substrate 11', and a light blocking layer 12' formed on the transparent substrate 11', wherein the light blocking layer 12' comprises an exposure region 13'. The conventional exposure region 13' does not comprise any optical translucent film (corresponding to a complete exposure region) or any uniform optical translucent film (corresponding to a partial exposure region), so that the intensity of light that is transmitted through the exposure region 13' is higher in a center region and lower in an edge region, as shown by the curve 3' in FIG. 1. Accordingly, a post spacer 21' formed on a color film substrate 2' by using the grayscale mask plate 1' has a top face which is higher in the center region and lower in the edge region, as shown in FIG. 1. The color film substrate 2' shown in FIG. 1 may further comprise a transparent substrate 22', a color film layer 23', an alignment layer 24', or the like.

Hereinafter, a grayscale mask plate and a method of fabricating the same, a color film substrate and a method of fabricating the same, and a display device of the present disclosure will be described in the following first to fifth exemplary embodiments.

Figure 4:
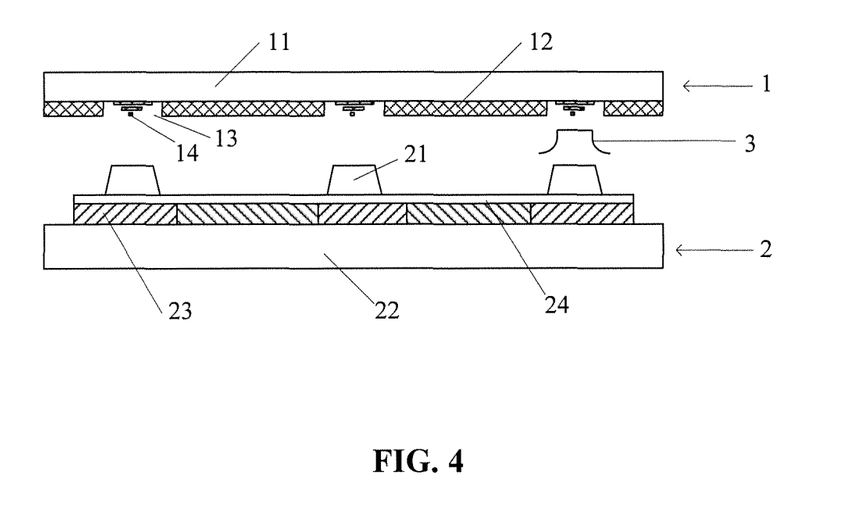
FIG. 4 is a schematic diagram illustrating a grayscale mask plate, according to a first exemplary embodiment, and a color film substrate formed by the same.
Figure 5:
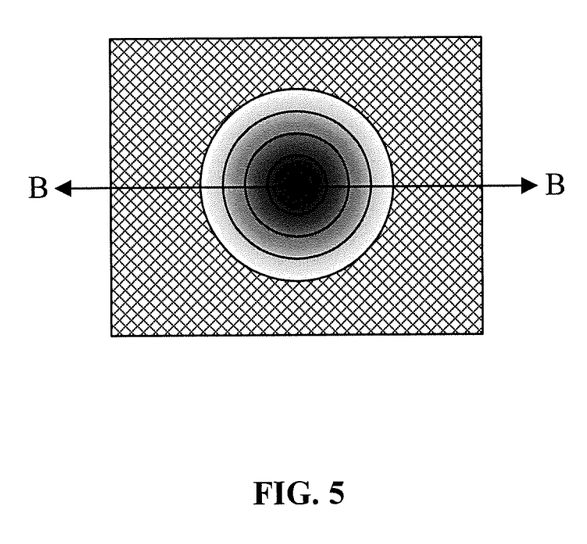
FIG. 5 is a schematic diagram illustrating an exposure region and its surrounding light-blocking part of the grayscale mask plate of FIG. 4.

In a first exemplary embodiment, as shown in FIG. 4, a grayscale mask plate 1 comprises a transparent substrate 11 and a light blocking layer 12 formed on the transparent substrate 1. The light blocking layer 12 comprises an exposure region 13. The exposure region 13 is provided with an optical translucent film 14. The optical translucent film 14 has a light blocking ratio which decreases gradually or stepwise from a center region to an edge region, as schematically shown in FIG. 5. In the present embodiment, the material for the spacer can comprise negative photoresist.

If the optical translucent film 14 was absent in the exposure region 13, the intensity of light transmitted through the exposure region 13 would be higher in the center region and lower in the edge region. Upon providing the optical translucent film 14 having a light transmitting ratio which is lower in the center region and higher in the edge region, the intensity of light that is transmitted through the exposure region 13 is rendered substantially uniform, as shown by the curve 3 in FIG. 4. As a result, the post spacer 21 fabricated by using the grayscale mask plate 1 has a top face which is substantially flat, instead of the convex shape of the top face of the conventional post spacer 21'. In this manner, under the action of an external force, the post spacer 21 exhibits a linear variation in its hardness, thus avoiding or alleviating defects like L0 light leakage and Touch Mura of the liquid crystal panel which is sensitive to variation of external pressure.

In order to provide the optical translucent film 14 with a light transmitting ratio which is lower in the center region and higher in the edge region, in the case that the optical translucent film 14 is a homogeneous material, it is only required that the thickness of the optical translucent film 14 should decrease gradually or stepwise from the center region to the edge region. In the former case, the optical translucent film can be realized by a single layer, the thickness of which is greater in the center region and lesser in the edge region. In the latter case, the optical translucent film can be realized by multiple layers of optical translucent film.

Of course, if the material of the optical translucent film 14 has a light blocking ratio which decreases gradually or stepwise from the center region to the edge region, the optical translucent film 14 with a light blocking ratio which decreases gradually or stepwise from the center region to the edge region can still be realized, even when the optical translucent film 14 is uniform in thickness.

Figure 6:
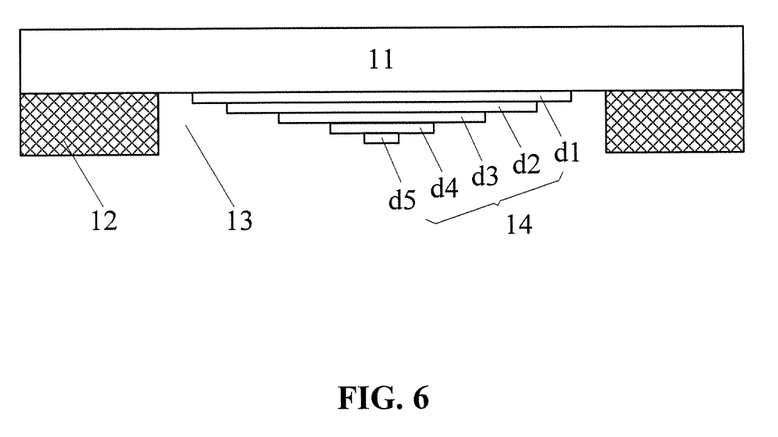
FIG. 6 is a cross-sectional view of the grayscale mask plate of FIG. 5 along the line B-B, according to one exemplary embodiment.
Figure 7:
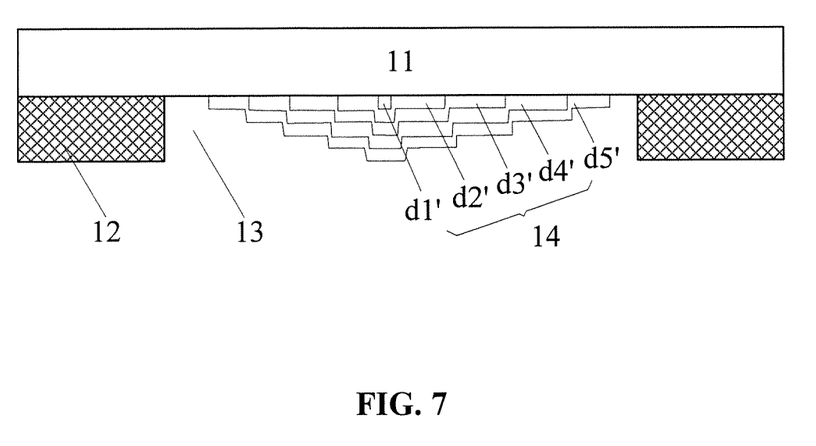
FIG. 7 is a cross-sectional view of the grayscale mask plate of FIG. 5 along the line B-B, according to another exemplary embodiment.

In order to provide the optical translucent film 14 having a thickness which is greater in the center region and lesser in the edge region, the optical translucent film 14 can comprise multiple layers of unit optical translucent film. For example, as shown in FIGS. 6 and 7, the optical translucent film 14 can comprise five layers of unit optical translucent film d1-d5 and d1'-d5', respectively. Of course, the optical translucent film 14 could also comprise more or fewer layers of unit optical translucent film.

In the exemplary embodiment shown in FIG. 6, the optical translucent film 14 comprises five layers of unit optical translucent film d1-d5. In the direction away from the transparent substrate 11, an upper layer of unit optical translucent film is formed above a lower layer of unit optical translucent film, and the upper layer of unit optical translucent film has a smaller area than the lower layer of unit optical translucent film.

In another exemplary embodiment shown in FIG. 7, the optical translucent film 14 comprises five layers of unit optical translucent film d1'-d5'. In the direction away from the transparent substrate 11, an upper layer of unit optical translucent film is formed above a lower layer of unit optical translucent film, and the upper layer of unit optical translucent film has a larger area than the lower layer of unit optical translucent film. Apart from the lowest layer of unit optical translucent film, each layer of unit optical translucent film is distributed in each layer from the lowest layer of unit optical translucent film to itself.

In both the exemplary embodiment shown in FIG. 6 and the exemplary embodiment shown in FIG. 7, the optical translucent film 14 has a thickness which decreases stepwise from the center region to the edge region. It is assumed that the light blocking ratio for a layer of unit optical translucent film is c% and there are n layers of unit optical translucent film in total. Then, the middlemost region of the optical translucent film 14 has a light blocking ratio of nc%, and the light blocking ratio decreases from (n-1)c% in the sub-middlemost region to c% in the edge region. Namely, the optical translucent film 14 has a light transmitting ratio which gradually increases from the center region to the edge region.

In the case where the optical translucent film 14 is absent from the exposure region 13, the intensity of light that is transmitted through the exposure region 13 decreases from the center region to the edge region. Conversely, in the case where the exposure region 13 is provided with the optical translucent film 14, the intensity of light that is transmitted through the exposure region 13 is substantially uniform from the center region to the edge region.

Since the optical translucent film 14 adopts a multi-layer construction and each layer of unit optical translucent film can have a uniform thickness, the optical translucent film 14 can be formed by an existing optical translucent film deposition process in a layer-by-layer manner. In this way, the optical translucent film 14 and the grayscale mask plate 1 can be fabricated with a relatively simple process, and there is no need to develop a completely new process.

Of course, as needed, the grayscale mask plate 1 may further comprise other portions and components.

Figure 8:
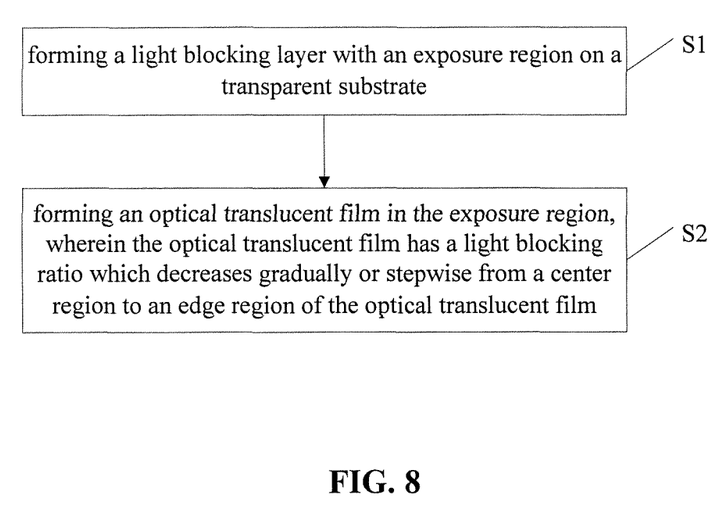
FIG. 8 is a flow chart illustrating a method of fabricating a grayscale mask plate, according to a second exemplary embodiment.

In a second exemplary embodiment, as shown in FIG. 8, a method of fabricating a grayscale mask plate comprises steps S1 and S2. In step S1, a light blocking layer with an exposure region is formed on a transparent substrate. In step S2, an optical translucent film is formed in the exposure region. The optical translucent film has a light blocking ratio which decreases gradually or stepwise from the center region to the edge region of the optical translucent film.

Step S1 can be carried out using known conventional processing, and as such will not be furthered described herein. As for step S2, a deposition method can be used to form an optical translucent film in the exposure region, and it is only required that the optical translucent film should have a light transmitting ratio which is lower in the center region and higher in the edge region. As described in the first exemplary embodiment, in order to provide an optical translucent film with a light transmitting ratio which is lower in the center region and higher in the edge region, when the optical translucent film is a homogeneous material, it is only required that the optical translucent film have a thickness which decreases from the center region to the edge region. The optical translucent film can have a thickness which decreases gradually or stepwise from the center region to the edge region. In the former case, the optical translucent film can be realized by a single layer the thickness of which is greater in the center region and lesser in the edge region. In the latter case, the optical translucent film can be realized by multiple layers of optical translucent film. Of course, if the material of the optical translucent film has a light transmitting ratio which is lower in the center region and higher in the edge region, such an optical translucent film can still be realized even when the optical translucent film is uniform in thickness.

One of the techniques for forming the optical translucent film in the exposure region is to form multiple layers of unit optical translucent film in the exposure region in sequence, e.g., to deposit in sequence each layer of unit optical translucent film. In one case, multiple layers of unit optical translucent film are deposited in the exposure region in sequence, so that in the direction away from the transparent substrate, an upper layer of unit optical translucent film is formed above a lower layer of unit optical translucent film, and the upper layer of unit optical translucent film has a smaller area than the lower layer of unit optical translucent film. The resultant optical translucent film is shown in FIG. 6. In another case, multiple layers of unit optical translucent film are deposited in the exposure region in sequence, so that in the direction away from the transparent substrate, an upper layer of unit optical translucent film is formed above a lower layer of unit optical translucent film, the upper layer of unit optical translucent film has a larger area than the lower layer of unit optical translucent film, and apart from the lowest layer of unit optical translucent film, each layer of unit optical translucent film is distributed in each layer from the lowest layer of unit optical translucent film to itself. The resultant optical translucent film is shown in FIG. 7. In both cases, the optical translucent film has a thickness which decreases stepwise from the center region to the edge region. In these cases, since the optical translucent film is formed in sequence in a layer-by-layer manner, each layer of unit optical translucent film can have a uniform thickness. As a result, the optical translucent film can be formed by performing an existing deposition process several times. Therefore, the optical translucent film can be fabricated with a relatively simple process, and there is no need to develop a completely new process.

Of course, as needed, the present method of fabricating a grayscale mask plate may further comprise other steps or details. The grayscale mask plate of the first exemplary embodiment can be fabricated by the method of the second exemplary embodiment, although the present disclosure is not limited thereto.

Figure 9:
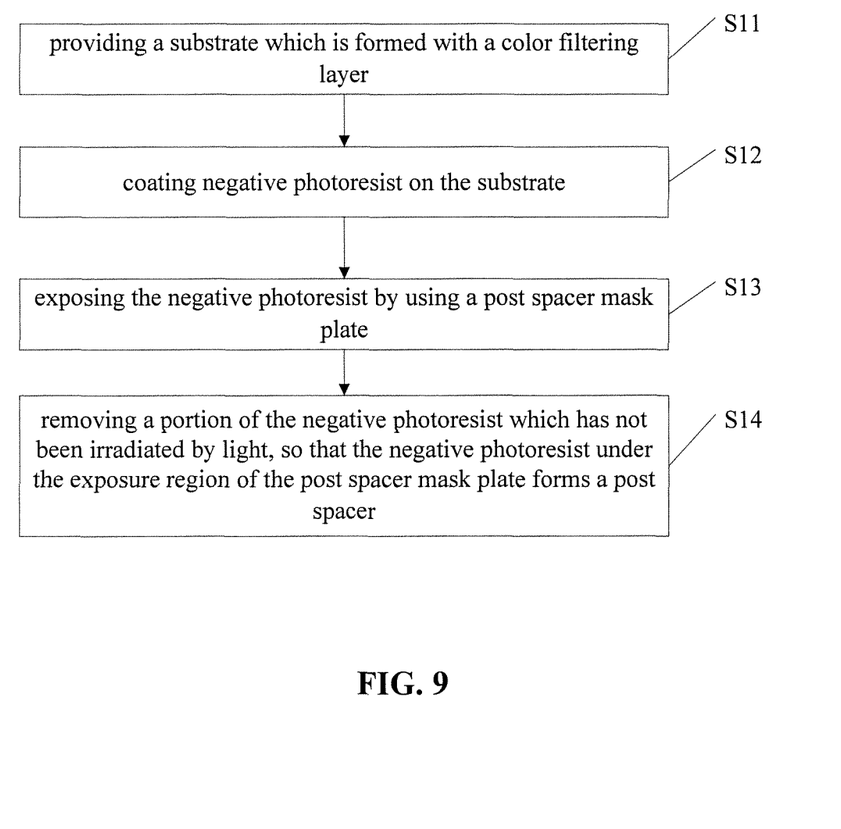
FIG. 9 is a flow chart illustrating a method of fabricating a color film substrate, according to a third exemplary embodiment.

In a third exemplary embodiment, as shown in FIG. 9, a method of fabricating a color film substrate comprises steps S11, S12, S13, and S14.

In step S11, a substrate which is formed with a color filtering layer is provided. In step S12, negative photoresist is coated on the substrate. In step S13, the negative photoresist is exposed by using the grayscale mask plate of the first exemplary embodiment. In step S14, a portion of the negative photoresist which has not been irradiated by light is dissolved and removed, such that the negative photoresist under the exposure region of the grayscale mask plate forms a post spacer.

The substrate which is formed with a color filtering layer in step S11 can be formed in any suitable manner. Steps S12-S14 indicate the specific manner in which the post spacer is formed, and a significant improvement lies in that the grayscale mask plate of the first exemplary embodiment is used for exposing, so that the resultant post spacer has a flat top face.

Figure 10:
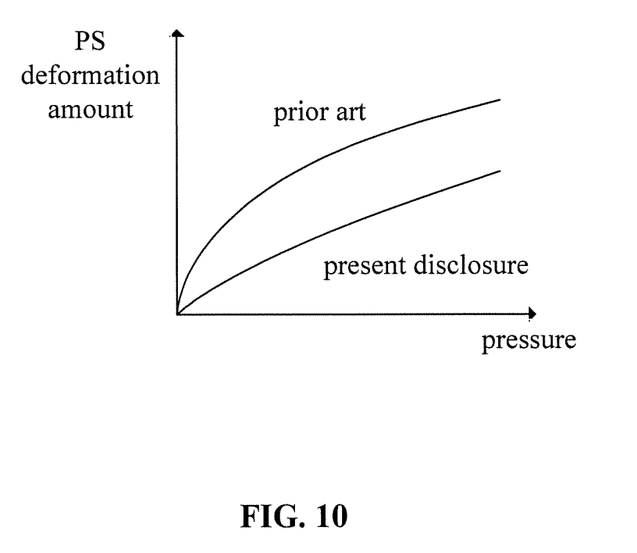
FIG. 10 is a graph illustrating the relationship between deformation and pressure for a post spacer subject to a pressure for a liquid crystal panel of a display device, according to a fourth exemplary embodiment, and a liquid crystal panel of a conventional display device.

In a fourth exemplary embodiment, as shown in FIG. 10, a color film substrate is fabricated by the method of fabricating a color film substrate according to the third exemplary embodiment. As shown in FIG. 4, the post spacer 21 formed on the color film substrate 2 has a substantially flat top face. Of course, as needed, the color film substrate 2 can further comprise other portions and components, such as the transparent substrate 22, the color film layer 23, and the alignment layer 24 shown in FIG. 4.

In a fifth exemplary embodiment, a display device comprises an array substrate and the color film substrate 2 of the fourth exemplary embodiment which are arranged opposite to one another. The post spacer 21 of the color film substrate forms a space between the color film substrate 2 and the array substrate, wherein liquid crystal is disposed in the space. Of course, as needed, the display device can further comprise other portions and components, such as a polarizing plate, a driving circuit, etc.

The display device can be, for example, any product or component with a display function like a mobile phone, tablet computer, TV, monitor, notebook computer, digital photo frame, GPS navigator, and the like.

As shown in FIG. 10, when the liquid crystal panel of the display device is subject to pressure, the post spacer of the prior art exhibits a nonlinear variation in the deformation amount, while the post spacer of the present invention exhibits a linear variation in the deformation amount. It is apparent, in this aspect, that the post spacer of the present disclosure is superior to the conventional post spacer, thus avoiding or alleviating defects like L0 light leakage and Touch Mura of the liquid crystal panel which is sensitive to variation of external pressure.

Although the present disclosure has been described with reference to specific embodiments, it should be understood that the limitations of the described embodiments are provided merely for purpose of illustration and are not intended to limit the present invention and associated general inventive concepts. Instead, the scope of the present invention is defined by the appended claims, and all variations and equivalents that fall within the range of the claims are intended to be embraced therein. Thus, other embodiments than the specific exemplary ones described herein are equally possible within the scope of these appended claims.

The invention claimed is:

1. A method for fabricating a color film substrate, comprising steps of:
    providing a substrate which is formed with a color filtering layer;
    coating negative photoresist on the substrate;
    exposing the negative photoresist by using a grayscale mask plate; and
    removing a portion of the negative photoresist which has not been irradiated by light, so that the negative photoresist under the exposure region of the grayscale mask plate forms a post spacer,
    wherein the grayscale mask plate comprises a transparent substrate and a light blocking layer on the transparent substrate, the light blocking layer comprising an exposure region, wherein the exposure region is provided with an optical translucent film, and the optical translucent film has a light blocking ratio which decreases stepwise from a center region to an edge region of the optical translucent film, and
    wherein the optical translucent film comprises multiple layers of unit optical translucent film, each layer of unit optical translucent film is of a uniform thickness, and a thickness of the optical translucent film decreases stepwise from the center region to the edge region of the optical translucent film.

2. The method of claim 1, wherein as for the multiple layers of unit optical translucent film, in the direction away from the transparent substrate, an upper layer of unit optical translucent film is formed above a lower layer of unit optical translucent film, and the upper layer of unit optical translucent film has a smaller area than the lower layer of unit optical translucent film.

3. The method of claim 1, wherein as for the multiple layers of unit optical translucent film, in the direction away from the transparent substrate, an upper layer of unit optical translucent film is formed above a lower layer of unit optical translucent film, the upper layer of unit optical translucent film has a larger area than the lower layer of unit optical translucent film, and apart from the lowest layer of unit optical translucent film, each layer of unit optical translucent film is distributed in each layer from the lowest layer of unit optical translucent film to itself.

4. The method of claim 1, wherein the optical translucent film comprises five layers of unit optical translucent film.

* * * * *